United States Patent [19]
Steckler

[11] 3,815,051
[45] June 4, 1974

[54] CONTROLLED OSCILLATOR

[75] Inventor: Steven Alan Steckler, Clark, N.J.

[73] Assignee: RCA Corporation, New York, N.Y.

[22] Filed: Dec. 29, 1972

[21] Appl. No.: 319,364

[52] U.S. Cl. .......................... 331/117 R, 331/177 R
[51] Int. Cl. .......................... H03b 3/04, H03b 5/12
[58] Field of Search ........ 331/34, 36, 117, 177, 180

[56] References Cited

UNITED STATES PATENTS 3,636,475 1/1972 Steckler .......................... 331/117 R

*Primary Examiner*—John Kominski
*Attorney, Agent, or Firm*—Eugene M. Whitacre; Kenneth R. Schaefer

[57] ABSTRACT

A controlled oscillator having an anti-resonant tank circuit tuned by an admixture of an adjustable portion of quadrature current responsive to oscillation signals appearing across the tank circuit. The adjustable portion of quadrature current is provided by adjustably splitting a fixed quadrature current into first and second fractions in a current splitter in response to a control signal, then subtracting the first fraction from the second to obtain a difference current which is applied to the tank circuit.

7 Claims, 3 Drawing Figures

CONTROLLED OSCILLATOR

The present invention relates to controlled oscillators of the type used in an automatic phase and frequency control (AFPC) system, where the oscillator frequency is to be unaffectd by the control apparatus in the absence of correction signal — e.g., as may be employed as the horizontal oscillator of a television receiver.

Controlled oscillators of the reactance-device type, in which a quadrature current responsive to signal voltages in an oscillator anti-resonant tank circuit are reapplied in controlled amounts to the tank circuit to control the tuning of the oscillator, have been long known. Controlled oscillators in which the frequency of oscillations is unaffected by the control apparatus when an AFPC system associated therewith indicates that no frequency correction need be made can use pre-tuned tank circuit elements. For example, my U.S. Pat. No. 3,636,475, entitled "OSCILLATOR WITH VARIABLE REACTIVE CURRENT FREQUENCY CONTROL," issued Jan. 18, 1972, and assigned to RCA Corporation, describes in FIG. 4 of the drawing and Column 7, line 61, through Column 8, line 6, of its specification control apparatus having inversely adjustable current splitting means respectively applying leading and lagging currents to the anti-resonant tank circuit of an oscillator to control its frequency.

The present invention is embodied in a controlled oscillator having a source of control signals, an inductor and a capacitor connected as the elements of an anti-resonant circuit, a source to replenish losses in that anti-resonant circuit to sustain oscillations therein, and a source of reactive signals responsive to those oscillations. The fundamental frequency of the reactive signal is in substantially quadrature phasing with the oscillations as they appear across the anti-resonant circuit and is divided into a first and a second fraction by signal splitter means. The ratio of the first and second fractions provided by the signal splitter means is determined in response to control signals supplied from the source of control signals. Means to subtract the first fraction from the second fraction provides a difference signal, which is then applied to the anti-resonant circuit.

The present invention will be better understood by reference to the following specification and the accompanying drawing in which.

Figure 1:
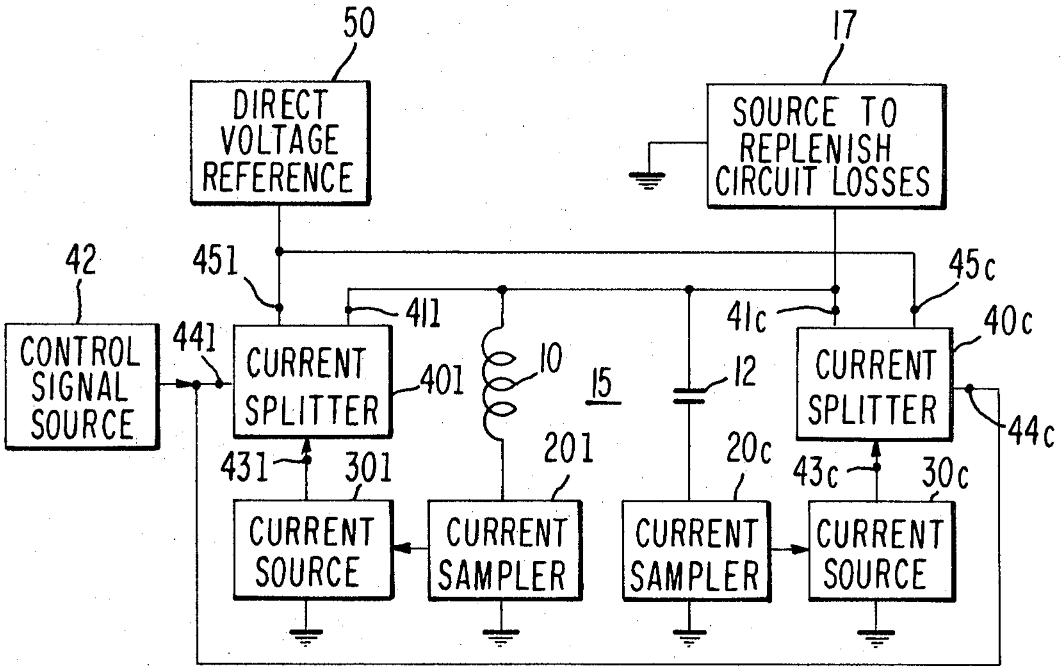
FIG. 1. PRIOR ART
FIG. 1 shows in block schematic form the prior art as exemplified in my aforementioned patent.

Referring now to FIG. 1, an inductor 10 and a capacitor 12 are connected in an anti-resonant tank circuit 15 and to a source 17 to replenish circuit losses. Accordingly, oscillations are sustained in the tank circuit 15. The reactive currents in each of the inductor 10 and capacitor 12 are sampled in current samplers 20*l* and 20*c*, respectively. Each of the current samplers 20*l*, 20*c* presents a very low impedance to current flow therethrough, so the inductor 10 and capacitor 12 are in effect parallel-connected.

The current sources 30*l* and 30*c* provide reactive currents responsive to the currents in the inductor 10 and the capacitor 12, respectively, as measured by the current samplers 20*l* and 20*c*, respectively. These currents are applied to terminals 43*l* and 43*c*, respectively, as input signals to current splitters 40*l* and 40*c*, respectively.

The current splitter 40*l* divides the current applied to the terminal 43*l* into a first fraction supplied from terminal 41*l* to the tank circuit 15 and a second fraction discarded via terminal 45*l* connected to the direct voltage reference 50. The ratio of the first fraction to the second as provided by the current splitter 40*l* is determined in response to control signals applied from a control signal source 42 to terminal 44*l*, increasing for a first direction of swing for the control signal and decreasing for a second.

Similarly, the current splitter 40*c* divides the current applied to terminal 43*c* into a first fraction supplied from terminal 41*c* to the tank circuit 15 and a second fraction discarded via its terminal 45*c* connected to the direct voltage reference 50. The ratio of the first fraction to the second as provided by the current splitter 40*c* is determined in response to control signals applied from a control signal source 42 to terminal 44*c*, decreasing for a first direction of swing of the control signal and increasing for a second opposite direction of swing.

The circuitry thus far described is so proportioned that, when the control signal provided by the source 42 is at a median value, the first fractions of reactive current supplied from current splitters 40*l* and 40c from terminals 41*l* and 41*c*, respectively, are of equal amplitude. The one being inductively reactive and the other capacitatively reactive, these first fractions of reactive current are of opposite phasing. When added together and applied to the tank circuit 15, the effects of these fractions of current on the tuning of the tank circuit 15 cancel each other. At the median value of control signal then, the oscillating frequency of the tank circuit is determined by the inductor 10 and capacitor 12. This permits the use of a pre-tuned combination of inductor 10 and capacitor 12 to determine accurately the nominal oscillator frequency.

As the control signal provided by the source 42 increases in the first direction of swing, the inductively reactive current provided as a first fraction from current splitter 40*l* predominates over the capacitatively reactive current provided as a first fraction from current splitter 40*c*. The total inductively reactive current flowing in the tank circuit 15 is increased, simulating the condition of lessened inductance in the tank circuit 15, so the frequency of oscillation increases. As the control signal provided by the source 42 increases in a second direction of swing, the capacitatively reactive current provided as a first fraction from current splitter 40*c* predominates over the inductively reactive current provided as a first fraction from current splitter 40*l*. The total capacitatively reactive current flowing in the tank circuit 15 is increased, simulating the condition of increased capacitance in the tank circuit 15, so the frequency of oscillation decreases.

Figure 2:
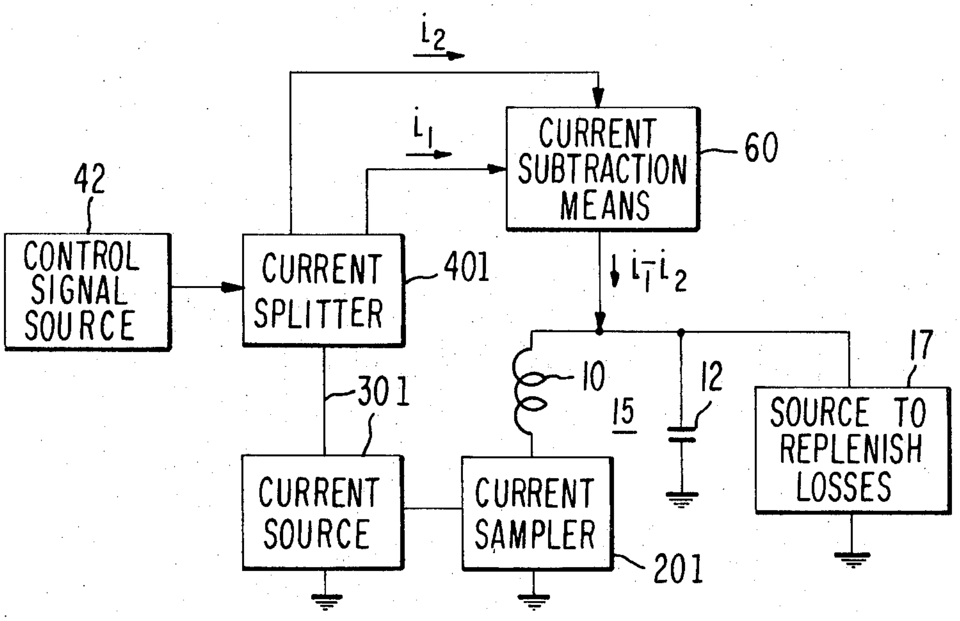
FIG. 2 shows in block schematic form apparatus in which the present invention is embodied.

Referring now to FIG. 2, the elements 10, 12, 17, 20*l*, 30*l*, and 40*l* and 42 are connected to perform substantially the same functions of sampling inductively reactive current in the inductor 10, controllably splitting (in 40*l*) a current proportional to the inductively reactive current (from source 30*l*) into first and second fractions $i_1$, $i_2$ and applying the first fraction $i_1$ to the anti-resonant tank circuit 15 including the inductor 10. The fraction of capacitatively reactive current to be applied to the anti-resonant tank circuit is obtained — not by means of a separate current sampler 20c, current source 30c and current splitter 40c — but rather by subtracting in current subtraction means 60 the second fraction $i_2$ from the current splitter 40l from the first fraction $i_1$ applied to the anti-resonant tank circuit 15. For example, such subtraction may be accomplished by inverting the direction of signal swing of the second fraction $i_2$ and then summing the inverted signal with the first fraction $i_1$.

When th source 42 provides a median value of control signal, the first and second reactive current fractions $i_1$, $i_2$ are equal to each other. Subtracting the one from the other in the current subtraction means 60 results in zero difference signal current being applied to the tank circuit 15. The oscillator frequency is determined, therefore, by the natural frequency of the tank circuit 15 — that is, only by the inductor 10 and the capacitor 12.

As the control signal is adjusted in a first direction of swing, increasing $i_1$ and decreasing $i_2$, inductively reactive current flow predominates in the output current ($i_1 - i_2$) provided from the current subtraction means to the tank circuit 15. Therefore, the oscillator frequency increases. As the control signal is adjusted in a second direction of swing, opposite to the first, decreasing $i_1$ and increasing $i_2$, reactive current flow anti-phase to inductively reactive current flow predominates in the output current ($i_1 - i_2$) provided from the current subtraction means to the tank circuit 15. That is, an equivalent capacitatively reactive current is supplied to the tank circuit 15 from the current subtraction means 60. Therefore, the oscillator frequency decreases.

The present invention provides a substantial saving in circuitry and the power supply requirement to such circuitry, there being no need for elements 20c, 30c and 40c. The invention avoids the problems of matching the current sampling circuits 20l and 20c, the current sources 30l and 30c and the current splitters 40l and 40c, respectively to their corresponding elements in order that no reactive current is supplied to the tank circuit when the control voltage is at median value. Variations of current gain in the current sampler 20l and in the current source 30l thereby controlled — such as may occur in response to temperature change altering component device characteristics, for example — will not affect the center tuning of the tank circuit 15.

While FIG. 2 shows an embodiment of the present invention in which the quadrature current in the inductor 10 is sampled while that in the capacitor 12 is not, alternatively the quadrature current in the capacitor 12 might be sampled to regulate the current source supplying the current splitter and that in the inductor not be sampled.

Figure 3:
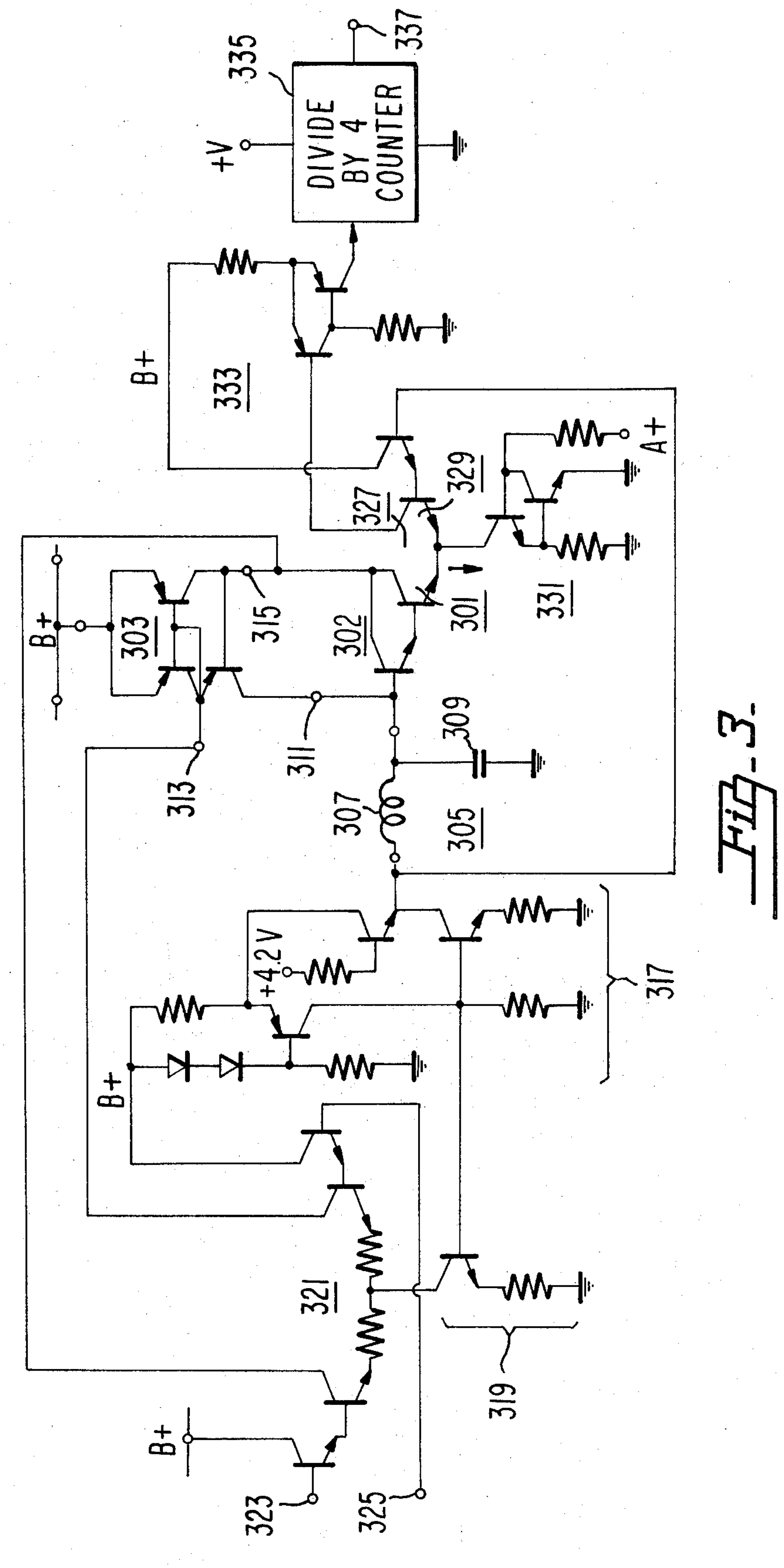
FIG. 3 shows in schematic form apparatus which is a preferred embodiment of the present invention for use as the horizontal oscillator of a television receiver.

FIG. 3 is a schematic diagram of a particular embodiment of the present invention, which illustrates how economically the current subtraction means 60 may be realized. The signal combining circuit 303 used for this function is described in my concurrently filed United States appliation Ser. No. (RCA 64,737), entitled "SIGNAL COMBINING CIRCUIT" and assigned to RCA Corporation. Output current supplied by the signal combining circuit 303 from terminal 311 is, within the range of its linear operation, equal to input current supplied to terminal 313 minus input current supplied to terminal 315. The amplifier 303 differentially combines input signal currents as applied to input terminals 313, 315.

The variations of the collector current of transistor 301 applied to terminal 315 are inverted within the signal combining circuit 303. These inverted current variations are supplied to the base electrode of transistor 302 in Darlington connection with transistor 301 to be amplified and inverted again by the transistors 301, 302. This regenerative amplifier connection forms an effective negative resistance element in parallel with the tank circuit 305, comprising inductor 307 and capacitor 309, and replenishes circuit losses to sustain oscillations.

The inductively reactive current in the inductor 307 is sampled in the current sampler circuit 317; and a corresponding current is provided by the current source 319 to the current splitter 321. The current sampler circuit 317 and the current source 319 are of the nature of the circuitry described in my U.S. Pat. No. 3,641,448, entitled "TRANSISTOR SIGNAL TRANSLATING STAGE," issued Feb. 8, 1972, and assigned to RCA Corporation.

The current splitter 321 is of the conventional emitter-coupled transistor differential amplifier type, responsive to control signal voltages as applied between terminals 323 and 325 to split the reactive signal current provided from the source 319 into a first fraction applied to the terminal 313 and a second fraction applied to the terminal 315.

The limiting function to control the amplitude of oscillations in the tank circuit 305 is provided in the configuration shown in FIG. 3 by arranging the common-emitter amplifier transistor 301 to be in an emitter-coupled transistor amplifier-limiter configuration 327 with transistor 329. Their joined emitter electrodes are provided a constant current from the current source 331, which effectively places an upward limit upon their collector currents. Output signal currents from the controlled oscillator are taken from the collector electrode of transistor 329. These output signal currents, square waves complementary to those in the collector current of the amplifier transistor 301, are applied to a current inverting amplifier 333.

It is convenient to proportion the inductor 307 and capacitor 309 so the center frequency of the controlled oscillator is four times the television horizontal scanning frequency (62,936 Hz). The inductor 307 is smaller than when the oscillator has a frequency equal to horizontal scanning frequency and, therefore, is more economical to manufacture. The problem of radiated scanning signals from the kinescope yoke (not shown) being coupled into the tank circuit 305 and affecting the oscillator phasing to cause bending of the picture on the kinescope screen is reduced.

The square wave output signals of the current inverting amplifier 333 are applied to a divide-by-four counter circuit 335 as a triggering waveform. The counter circuit 335, which may be of the type described in my previously filed United States Patent appication Ser. No. (RCA 66,372), entitled "DIRECT-COUPLED TRIGGERED FLIP-FLOP," and assigned to RCA Corporation, provides square waves at 15,734 Hz horizontal frequency rate at its output terminal 337 for coupling to a horizontal scanning amplifier and kinescope yoke (not shown).

What is claimed is:

1. A controlled oscillator comprising:
a source of control signals;
an inductor and a capacitor connected as the elements of an anti-resonant circuit;
a source to replenish losses in said anti-resonant circuit whereby oscillations are sustained within said anti-resonant circuit;
means for supplying reactive signals responsive to said oscillations and having a fundamental frequency component substantially in quadrature phasing with said oscillations as they appear across said anti-resonant circuit;
signals splitter means to divide controllably said reactive signal into first and second fractions, the ratio of said first and said second fractions being determined in response to control signals supplied to said signal splitter means from said source of control signals;
means to subtract said second fraction from said first fraction to provide a difference signal; and
means to apply said difference signal to said anti-resonant circuit.

2. A controlled oscillator as claimed in claim 1 wherein said means for supplying reactive signals comprises:
a source of reactive current responsive to the current in one of said elements of said anti-resonant circuit.

3. A controlled oscillator as claimed in claim 2 wherein said signal splitter means comprises:
a first and a second transistors having respective base electrodes between which said source of control signals is coupled, respective emitter electrodes coupled to each other and to said source of reactive current, and respective collector electrodes coupled to said means to subtract said second from said first fraction to provide, respectively, said first and said second of said reactive current thereto.

4. A controlled oscillator comprising:
a source of control signals;
an inductor and a capacitor connected as the elements of an anti-resonant circuit;
a source to replenish losses in said anti-resonant circuit whereby oscillations are sustained within said anti-resonant circuit;
means for supplying reactive signals responsive to said oscillations and having its fundamental frequency substantially in quadrature phasing with said oscillations as they appear across said anti-resonant circuit;
signal splitter means to divide controllably said reactive signal into a first and a second fractions, the ratio of which said first and said second fractions is determined in response to control signals supplied to said signal splitter means from said source of control signals;
means to provide an inverted signal opposite in phase to said second fraction in response thereto; and
means to apply said first fraction and said inverted signal to said anti-resonant circuit.

5. A controlled oscillator comprising:
a source of reference and operating potentials;
a source of control signals;
an inductor and a capacitor connected as the elements of an anti-resonant circuit;
means to provide first and second anti-phase reactive currents, each controllably proportional, as governed by said control signals, to the current flow in one of said elements in said tank circuit;
a signal inverting amplifier having an input and a common terminals between which said anti-resonant tank is coupled and having an output terminal;
means coupling said signal inverting amplifier common terminal to said reference potential;
first, second and third transistors each having a base, an emitter and a collector electrodes;
means connecting said first and second transistor emitter electrodes to receive said operating potential;
means connecting said first transistor collector electrode and said third transistor base electrode to said signal inverting amplifier output terminal and to receive said first reactive current;
means connecting said second transistor base and collector electrodes, said first transistor base electrode and said third transistor emitter electrode to receive said second rective current; and
means connecting said third transistor collector electrode to said signal inverting amplifier input terminal.

6. A controlled oscillator as claimed in claim 5 wherein said means to provide first and second anti-phase reactive currents comprises;
a source of current proportional to said current flow in said one of said elements in said tank circuit; and
fourth and fifth transistors having respective base electrodes between which said source of control signals is coupled, respective collector electrodes from which said first and said second reactive currents respectively are supplied, and respective emitter electrodes coupled together and to said source of proportional current.

7. A controlled oscillator as claimed in claim 5 wherein:
fourth and fifth transistors each having a base, an emitter and a collector electrodes are connected as an emitter-coupled differential amplifier;
said signal inverting amplifier is provided by common-emitter amplifier action of said fourth transistor,
a constant current source provides the combined quiescent emitter currents of said fourth and said fifth transistors, and
output signal from said oscillator is provided from said fifth transistor collector electrode.

* * * * *